United States Patent
Toyohara et al.

(10) Patent No.: US 9,158,042 B2
(45) Date of Patent: Oct. 13, 2015

(54) FRESNEL LENS SHEET FOR SOLAR CONCENTRATION AND DESIGN METHOD THEREFOR

(75) Inventors: Makoto Toyohara, Kamisu (JP); Youji Ono, Tainai (JP); Ichiro Matsuzaki, Kamisu (JP)

(73) Assignee: KURARAY CO., LTD., Kurashiki-shi (JP)

( * ) Notice: Subject to any disclaimer, the term of this patent is extended or adjusted under 35 U.S.C. 154(b) by 335 days.

(21) Appl. No.: 13/375,055

(22) PCT Filed: May 28, 2010

(86) PCT No.: PCT/JP2010/059100
§ 371 (c)(1),
(2), (4) Date: Feb. 13, 2012

(87) PCT Pub. No.: WO2010/137695
PCT Pub. Date: Dec. 2, 2010

(65) Prior Publication Data
US 2012/0132871 A1 May 31, 2012

(30) Foreign Application Priority Data
May 29, 2009 (JP) ................................. 2009-130388

(51) Int. Cl.
*F21V 9/04* (2006.01)
*F21V 9/06* (2006.01)
(Continued)

(52) U.S. Cl.
CPC . *G02B 3/08* (2013.01); *F24J 2/085* (2013.01); *G02B 19/0042* (2013.01); *H01L 31/0543* (2014.12); *F24J 2200/04* (2013.01); *Y02E 10/43* (2013.01); *Y02E 10/52* (2013.01)

(58) Field of Classification Search
USPC ............... 136/246, 259, 248, 252; 156/304.5; 252/589; 351/163; 522/96, 120; 524/86, 91, 492, 556, 558, 559; 250/226
See application file for complete search history.

(56) References Cited

U.S. PATENT DOCUMENTS

| | | | |
|---|---|---|---|
| 2004/0242735 A1 | 12/2004 | McMan et al. | |
| 2005/0159514 A1 * | 7/2005 | McMan et al. | 524/86 |
| 2009/0133737 A1 | 5/2009 | Anzawa et al. | |

FOREIGN PATENT DOCUMENTS

| | | | | |
|---|---|---|---|---|
| JP | 05-156113 | * | 6/1993 | ............ C08L 33/12 |
| JP | 5 156113 | | 6/1993 | |
| JP | 09-258011 | * | 10/1997 | ............ G02B 3/08 |
| JP | 2005 99802 | | 4/2005 | |
| JP | 2006-343435 | * | 12/2006 | ............ G02B 3/08 |

(Continued)

OTHER PUBLICATIONS

International Search Report Issued Aug. 17, 2010 in PCT/JP10/059100 filed May 28, 2010.

*Primary Examiner* — Bijan Ahvazi
(74) *Attorney, Agent, or Firm* — Oblon, McClelland, Maier & Neustadt, L.L.P.

(57) ABSTRACT

A design method for an optical sheet for solar concentration and an optical sheet for solar concentration obtained by means of the design method are disclosed. The design method is characterized in that, for a resin optical sheet for solar concentration containing an ultraviolet absorber in a base material thereof, an amount of the ultraviolet absorber to be contained in the base material is determined such that: in an accelerated degradation test by means of a metal-halide-lamp weathering test (device specification: JTM G 01:2000, Japan Testing Machinery Association), decrease in average transmittance in a wavelength range of 400 nm to 1850 nm after testing for an irradiation time $T_1$ satisfies the following equation (1)

$$\tau_{uv}(0)+\tau_{uv}(T_1) > \tau_0(0)+\tau_0(T_1) \qquad (1)$$

and that decrease in transmittance at each of wavelengths in the wavelength range from a corresponding initial value after testing for the irradiation time $T_1$ is not greater than 10%. $T_1$ is the accelerated test time required corresponding to the actual location of use. The optical sheet of the present invention is capable of efficiently concentrating light without decrease in transmittance while being used for a long time in an environment with a large amount of ultraviolet radiation.

22 Claims, 2 Drawing Sheets

(51) Int. Cl.
- *G02B 5/22* (2006.01)
- *G02B 5/26* (2006.01)
- *G02B 3/08* (2006.01)
- *F24J 2/08* (2006.01)
- *G02B 19/00* (2006.01)
- *H01L 31/054* (2014.01)
- *H01L 31/042* (2014.01)
- *H01L 31/00* (2006.01)

(56) References Cited

FOREIGN PATENT DOCUMENTS

| | | | | |
|---|---|---|---|---|
| JP | 2006 343435 | 12/2006 | | |
| JP | 2007 525550 | 9/2007 | | |
| JP | 2009-035698 | * 2/2009 | ............... | C09K 3/00 |
| WO | 2006 035698 | 4/2006 | | |
| WO | 2009 001505 | 12/2008 | | |

* cited by examiner

FRESNEL LENS SHEET FOR SOLAR CONCENTRATION AND DESIGN METHOD THEREFOR

BACKGROUND OF THE INVENTION

1. Field of the Invention

The present invention relates to: a Fresnel lens sheet for solar concentration which has a function to concentrate direct light from the sun and is used in a solar power plant to concentrate sunlight on solar cell units in attempt to improve the power generation efficiency; and a design method therefor.

2. Background Art

A concentrator photovoltaic device is a device configured to generate electric power by concentrating sunlight on solar cells through concentrating lenses. Each solar cell only needs to have an area large enough to receive the light concentrated by its corresponding lens, and thus can be reduced to a size that is significantly smaller than the lens size. Accordingly, the amount of the solar cell, which is very expensive among other parts of the power generating device, can be reduced, allowing a cost reduction. On the other hand, the use of lens requires the device to be used in an area having a large amount of direct light (long sunshine duration). In view of this, the concentrator photovoltaic device has started to be widely used as a power supply in areas having long sunshine durations and large lands that allow the device to be built in a large scale. Japanese Patent Application Publication No. 2006-343435, for example, can be cited as an example of the concentrator photovoltaic device.

To utilize light highly efficiently in general, a highly transparent acrylic resin or polycarbonate resin or the like is used for lenses used in general optical applications. These resins generally contain a predetermined amount of an ultraviolet absorber to prevent coloration, resin degradation, and the like of the lenses due to the influence of ultraviolet rays. These optical members are generally used indoors as a screen and a backlight member of a television, and therefore the amount of ultraviolet rays directly applied thereto is low, and the concentration of the added ultraviolet absorber is low as well. Moreover, as shown in an embodiment, etc. of Japanese Patent Application Publication No. Hei 05-156113, it is possible to add a large amount of the ultraviolet absorber to improve the light resistance of the resin. However, coloration may be caused by the ultraviolet absorber, which in turn causes optical problems such as decreasing the transmittance and external problems such as yellowing, as well as problems such as decreasing the formability. For this reason, the ultraviolet absorber is generally added at the lowest possible concentration.

However, due to the facts that lenses for solar concentration are used in an environment where they are irradiated with a significantly large amount of ultraviolet rays, they are required to be used for a long term such as 20 years or longer, and so on, it is necessary to add a large amount of ultraviolet absorber as described above, but at the present a proper amount thereof concerning influences of the coloration and degradation on the decrease in transmittance, an influence on the formability, and the like is unknown.

PATENT DOCUMENTS

Patent Document 1: Japanese Patent Application Publication No. 2006-343435

Patent Document 2: Japanese Patent Application Publication No. H05-156113

SUMMARY OF THE INVENTION

Problems to be Solved by the Invention

Thus, a lens sheet has been desired to be developed which is capable of efficiently concentrating light without decrease in transmittance while being used for a far longer time in an environment with a far larger amount of ultraviolet radiation than conventional optical applications.

Means for Solving the Problems

The above problem can be solved by a design method for an optical sheet for solar concentration containing an ultraviolet absorber in a base material thereof, wherein an amount of the ultraviolet absorber to be contained in the base material is determined such that, in an accelerated degradation test by means of a metal-halide-lamp weathering test (device specification: JTM G 01:2000, Japan Testing Machinery Association), decrease in average transmittance in a wavelength range of 400 nm to 1850 nm after testing for an irradiation time $T_1$ satisfies the following equation (1)

$$\tau uv(0) + \tau uv(T_1) > \tau_0(0) + \tau_0(T_1) \qquad (1)$$

and that decrease in transmittance at each of wavelengths in the wavelength range from a corresponding initial value after testing for the irradiation time $T_1$ is not greater than 10%, where $$T_1 = 150 \times 2.5 \times U_1/U_0 \times \{0.44 \times \ln(W_1/W_0) + 0.88\} \times \qquad (2)$$
$$\{(0.5 \times \cos(\alpha_1 - 23.4)) + \cos\alpha_1\}/\{(0.5 \times \cos(\alpha_0 - 23.4)) + \cos\alpha_0\}$$

$U_1$: an average sunshine duration in an environment in which the optical sheet for solar concentration is used, $W_1$: an average amount of water vapor in the environment in which the optical sheet for solar concentration is used, $\alpha_1$: a latitude of a location in which the optical sheet for solar concentration is used, $U_0$: a sunshine duration in a location (Miyakojima) in which an outdoor exposure test has actually been conducted, $W_0$: an average amount of water vapor in the location (Miyakojima) in which the outdoor exposure test has actually been conducted, $\alpha_0$: a latitude of the location (Miyakojima) in which the outdoor exposure test has actually been conducted, $\tau uv(0)$: an average transmittance of the optical sheet for solar concentration of the present invention in the wavelength range of 400 nm to 1850 nm before the weathering test, $\tau uv(1)$: an average transmittance of the optical sheet for solar concentration of the present invention in the wavelength range of 400 nm to 1850 nm after the time $T_1$ of the weathering test, $\tau_0(0)$: an average transmittance of an optical sheet for solar concentration in the wavelength range of 400 nm to 1850 nm before the weathering test, the optical sheet being the same as that of the present invention but containing no ultraviolet absorber, and $\tau_0(T_1)$: an average transmittance of the optical sheet for solar concentration, being the same as that of the present invention but containing no ultraviolet absorber, in the wavelength range of 400 nm to 1850 nm after the time $T_1$ of the weathering test.

Moreover, in the present invention, the decrease in the average transmittance is preferably not greater than 7% of an initial value thereof, and decrease in transmittance at each of wavelengths in a wavelength range of 400 nm to 1000 nm is preferably not greater than 10% of a corresponding initial value.

Moreover, in the optical sheet for solar concentration of the present invention, the base material is preferably an acrylic resin, the ultraviolet absorber is preferably based on benzotriazole, and the ultraviolet absorber is more preferably added by at least 1400 ppm.

Further, the above problem can be solved by a design method for a resin optical sheet for solar concentration containing an ultraviolet absorber in a base material thereof, wherein an amount of the ultraviolet absorber to be contained in the base material is determined such that, in an accelerated degradation test by means of a metal-halide-lamp weathering test (device specification: JTM G 01:2000, Japan Testing Machinery Association), decrease in average transmittance in a wavelength range of 400 nm to 1850 nm after testing for an irradiation time $T_1$ satisfies $$\tau uv(0)+\tau uv(T_1) > \tau_0(0)+\tau_0(T_1) \qquad (1)$$

and that decrease in transmittance at each of wavelengths in the wavelength range from a corresponding initial value after testing for the irradiation time $T_1$ is not greater than 10%, where $$T_1=150\times 2.5\times D_1/D_0 \qquad (3)$$

$D_1$: an average amount of direct solar radiation in an environment in which the optical sheet for solar concentration is used, $D_0$: an average amount of direct solar radiation in a location (Miyakojima) in which an outdoor exposure test has actually been conducted, $\tau uv(0)$: an average transmittance of the optical sheet for solar concentration of the present invention in the wavelength range of 400 nm, to 1850 nm before the weathering test, $\tau uv(1)$: an average transmittance of the optical sheet for solar concentration of the present invention in the wavelength range of 400 nm to 1850 nm after the time $T_1$ of the weathering test, $\tau_0(0)$: an average transmittance of an optical sheet for solar concentration in the wavelength range of 400 nm to 1850 nm before the weathering test, the optical sheet being the same as that of the present invention but containing no ultraviolet absorber, and $\tau_0(T_1)$: an average transmittance of the optical sheet for solar concentration, being the same as that of the present invention but containing no ultraviolet absorber, in the wavelength range of 400 nm to 1850 nm after the time $T_1$ of the weathering test.

Effect of the Invention

With the present invention, it is possible to manufacture a Fresnel lens sheet which: experiences only a small decrease in transmittance by ultraviolet degradation from long-term outdoor exposure; maintains its light concentration efficiency at the initial value; and is excellent in formability.

MODE FOR EMBODYING THE INVENTION

Figure 1:
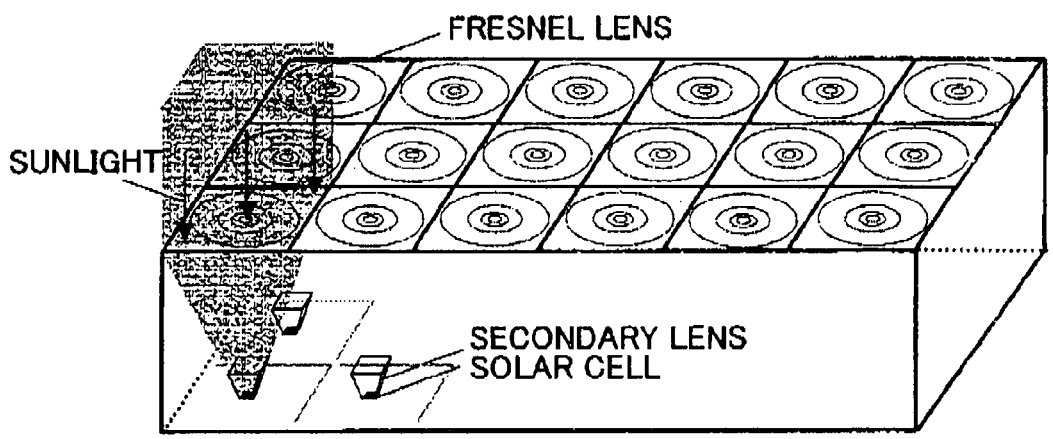
FIG. 1 is a schematic diagram of a concentrator photovoltaic system.

FIG. 1 shows an example photovoltaic device using Fresnel lenses. The structure is such that light having reached each lens is refracted by a corresponding lens portion and concentrated on a solar cell given at a corresponding predetermined portion. Moreover, a glass or metal secondary concentrating lens is often used in front of the solar cell to improve the concentration efficiency.

The Fresnel lens sheet mentioned earlier is often used as a Fresnel-lens assembly as shown in FIG. 1. In each Fresnel lens, a concentric prism is formed in a base material made of a transparent resin. For the formation of the concentric prism, press molding, injection molding, 2P (Photo Polymerization) molding using an ultraviolet curing resin, or the like can be employed.

For the transparent resin as the base material, various transparent resins are available such as an acrylic resin and a polycarbonate resin. In view of weather resistance, it is preferable to mainly use an acrylic resin, and, in specific, polymethyl methacrylate (PMMA) resin.

The base material of the Fresnel lens sheet for solar concentration in the present invention contains an ultraviolet absorber for the purpose of preventing degradation by ultraviolet rays included in sunlight. As the ultraviolet absorber to be contained, various ultraviolet absorbers are available. However, those having an absorption wavelength end below 400 nm, and, in specific, within a range of 350 nm to 380 nm are preferable. In this respect, a benzotriazole-based ultraviolet absorber is preferable.

Figure 2:
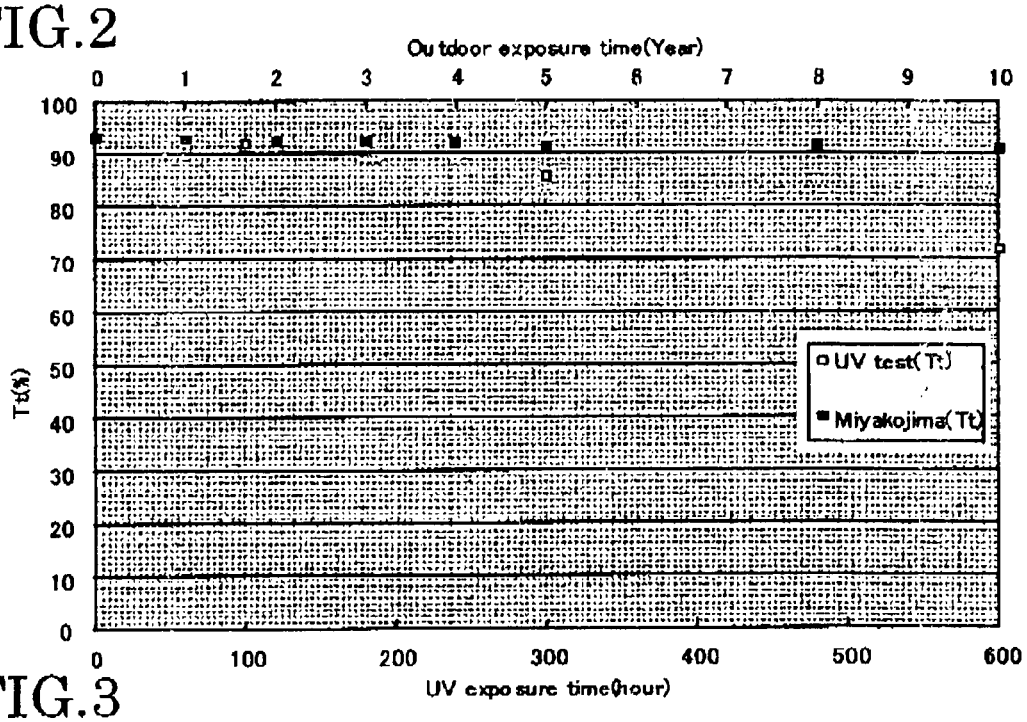
FIG. 2 is a chart showing changes in transmittance of a Fresnel lens sheet obtained through outdoor exposure and an accelerated test.

As shown in FIG. 2, we actually conducted an outdoor exposure test in Miyakojima on PMMA resin used as a material for a Fresnel lens sheet containing a benzotriazole-base ultraviolet absorber, and observed changes in the transmittance thereof. The result clearly shows that 10 years of the outdoor exposure does not decrease the transmittance.

Next, we conducted an ultra accelerated weathering test in a predetermined environment by using a testing machine specified by the device specification JTM G01:2000. As the machine, we used an ultra accelerated weathering tester manufactured by Iwasaki Electric Co., Ltd (SUV-F1). FIG. 2 also shows the result of this test. The result shows that 150 hours of the accelerated test is equivalent to the 10 years, or more, of the outdoor exposure in Miyakojima.

Meanwhile, Table 1 shows environments of some exemplary regions where solar concentration modules may be installed. For example, in a case where Toledo in Spain is considered a location to actually install the solar modules, 10 years of exposure in Miyakojima is equivalent to approximately 6.5 years of exposure in Toledo, for example, because as compared to the environment of Miyakojima, the annual sunshine duration is approximately 1.7 times longer and also because the absorption of sunlight differs depending upon the humidity and the angle of solar radiation differs depending upon the latitude. Thus, in a case of considering use of the solar modules as long term as 25 years or longer in Toledo, it is necessary to consider approximately 40 years of use in Miyakojima. In other words, about 600 hours of the ultra accelerated testing is necessary. Likewise, in a case where Choshi is considered the installation location, about 410 hours of the ultra accelerated testing is necessary; Phoenix in the U.S., about 860 hours; Las Vegas, about 950 hours; and Miami, about 570 hours.

wavelengths of about 400 nm and shorter, and also because the ultraviolet absorber itself causes coloration as the amount thereof to be added increases. For these reasons, the amount of the ultraviolet absorber to be added should be kept as low as possible. On the other hand, adding no ultraviolet absorber decreases the average transmittance in the wavelength range of 400 nm to 1850 nm with the elapse of the testing time and

TABLE 1

|  | Location | | | | | | |
|---|---|---|---|---|---|---|---|
|  | Japan | | U.S. | | | | Spain |
|  | Choshi | Miyakojima | Phoenix | Las Vegas | Salt Lake City | Miami | Toledo |
| Latitude | 35° 43' | 24° 44' | 33.43° N | 36.08° N | 40.77° N | 25.80° N | 39.87° N |
| Longitude | 140° 45' | 125° 19' | 112.08° W | 115.17° W | 111.97° W | 80.27° W | 4.08° W |
| Altitude[m] |  |  | 339 | 664 | 1288 | 2 |  |
| Avg. max. temperature[° C.] | 18.8 | 26.2 | 29.75 | 26.2 | 17.6 | 28.2 | 26.1 |
| Amt. of saturated water vapor[mg/m$^3$] (at avg. max. temperature) | 16 | 24.5 | 30.3 | 24.5 | 15 | 27 | 24.5 |
| Avg. relative humidity[%] | 78 | 78 | 37 | 30 | 55 | 73 | 52 |
| Avg. amt. of water vapor[mg/m$^3$] | 12.5 | 19.1 | 11.2 | 7.6 | 8.3 | 19.7 | 12.7 |
| Sunshine duration[hours/year] | 1943 | 1769 | 3861 | 3811 | 2974 | 3132 | 3000 |
| $T_1$(from eqn. (2))[hours] | 406 | 375 | 858 | 955 | 690 | 571 | 595 |
| Amt. of direct solar radiation[kWh/year] |  | 1025 | 2482 | 2591 | 1862 | 1460 |  |
| $T_1$(from eqn. (3))[hours] |  | 375 | 908 | 948 | 681 | 534 |  |

The equation (2) mentioned earlier generalizes the above idea, and shows a necessary testing time that can be figured out from conversion into a time of use in Miyakojima which is equivalent to approximately 25 years of long-term use in the actual installation location, and further from a correlation between a result in Miyakojima and a result from the ultra accelerated weathering tester. Specifically, the equation (2) is an empirical equation in which "an accelerated testing time $T_1$=an accelerated testing time equivalent to 25 years in Miyakojima (150×2.5)×correction of the sunshine duration in the location of use×correction of the amount of water vapor in the location of use×correction of the latitude of the location of use." Note that while the absolute amount of water vapor in the atmosphere affects the solar radiation, the average relative humidity is usually one that is publically reported. For this reason, the amounts of water vapor in Miyakojima and the location of use are figured out by multiplying the amount of saturated water vapor at the average maximum temperature by the average relative humidity in Miyakojima and the location of use, respectively. For the values of the sunshine duration, humidity, and maximum temperature, it is desirable to use values issued by the country or region where the location of use belongs.

Meanwhile, there are cases where the installation location is where the annual amount of direct solar radiation thereof is publically reported. In such cases, the accelerated testing time T1 can be figured out by using the equation (3) instead of the equation (2).

Figure 3:
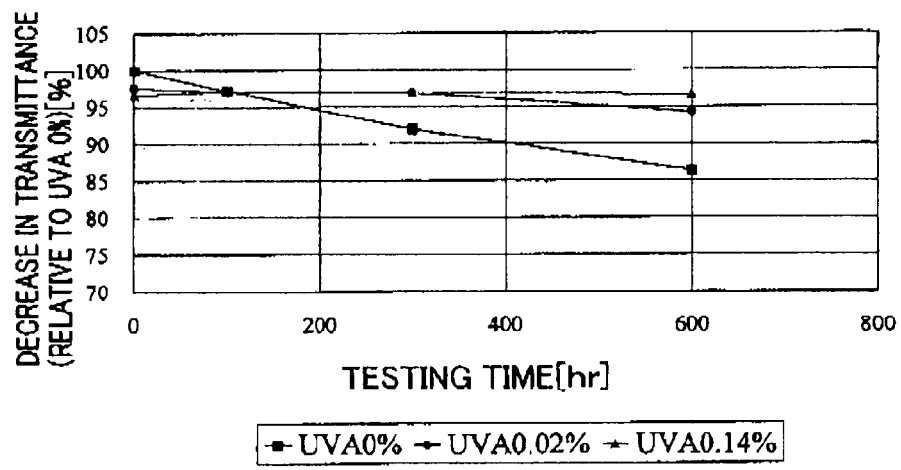
FIG. 3 is a chart showing changes in transmittance of Fresnel lens sheets obtained through an accelerated test up to 600 hours.

FIG. 3 shows changes in average transmittance in a wavelength range of 400 nm to 1850 nm after 600 hours of the accelerated test considering Toledo as the installation location. Here, for the transmittance measurement, a spectrophotometer U-3410 (manufactured by Hitachi) was used. Moreover, an acrylic resin (PMMA) was used as the base material, and a benzotriazole-based ultraviolet absorber JF-77 (manufactured by Johoku Chemical) was used as the ultraviolet absorber.

As the concentration of the ultraviolet absorber in the base material increases, the initial transmittance decreases. This is because the influence of the ultraviolet absorber cuts light of causes an approximately 14% decrease in transmittance after 600 hours as compared to the initial value. Thus, in a long-term use in the ultraviolet exposure atmosphere, the Fresnel lens assembly itself experiences decrease in transmittance and thereby decreases the amount of power generation. With this decrease set as the lower limit, the decrease in initial value needs to be not greater than 7%. In addition, in the accelerated exposure test, decrease equal to or greater than 7% must not occur.

Figure 4:
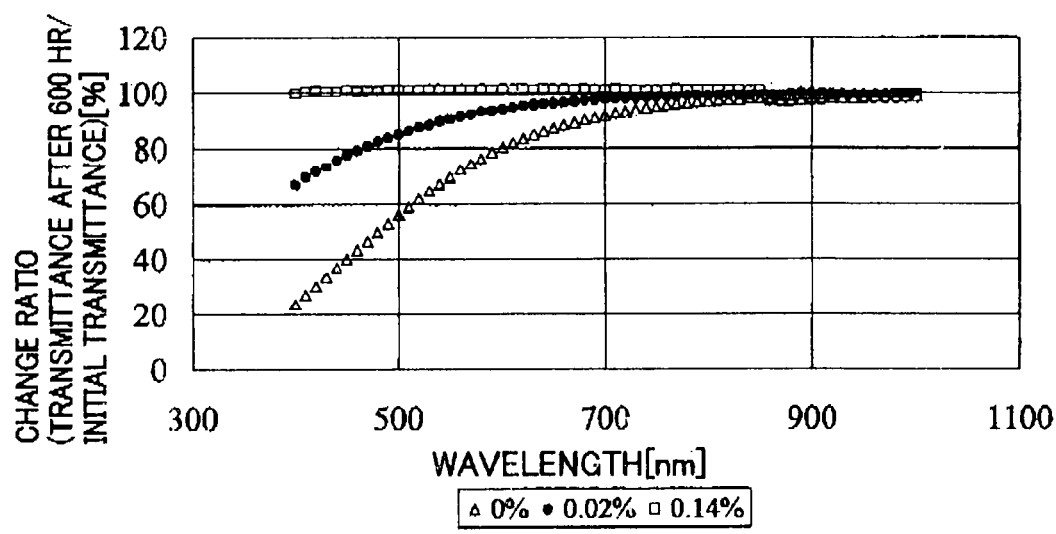
FIG. 4 is a chart showing changes in transmittance of the Fresnel lens sheets at each wavelength after the 600 hours of the accelerated test.
Figure 5:
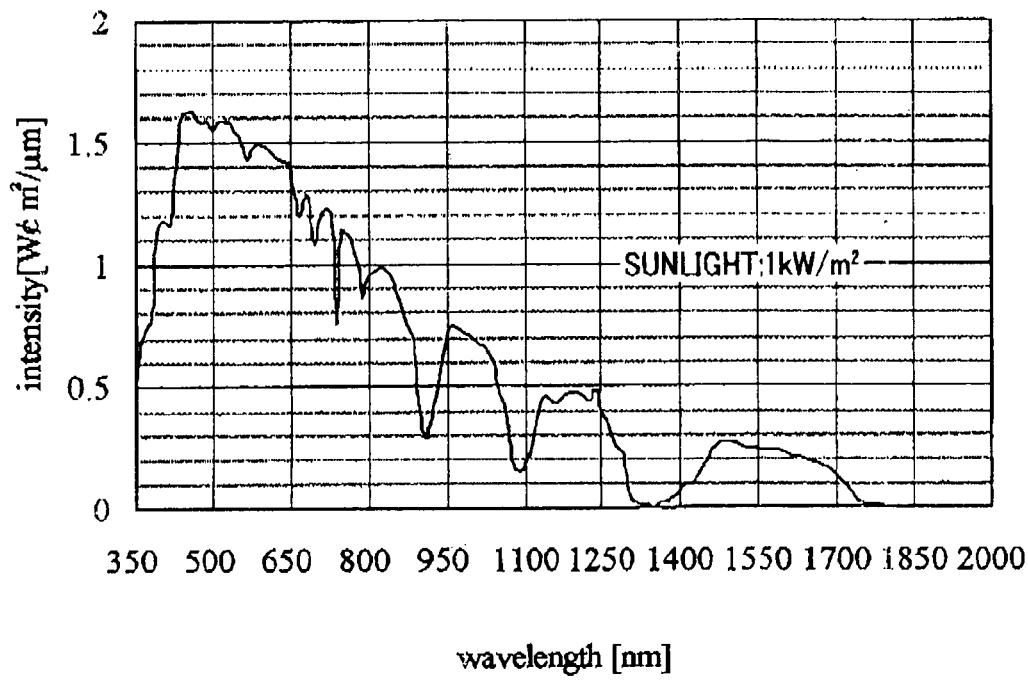
FIG. 5 is a chart showing the spectrum of sunlight.

Next, FIG. 4 shows the ratio of changes in transmittance in a wavelength range of 400 nm to 1000 nm after 600 hours of the accelerated test, to respective initial values. Resin degradation by ultraviolet rays occurs especially in this wavelength range, and coloration decreases the transmittance. In addition, since the light intensity of sunlight is high in this wavelength range as shown in FIG. 5, a loss of the transmittance in this range is related greatly to the amount of power generation. For this reason, the loss in this range needs to be suppressed as much as possible, and needs to be suppressed to 10% or below. Referring to FIG. 4, even when the added amount is 0.02%, a more than 30% decrease occurs in the transmittance at a wavelength of approximately 400 nm. On the other hand, when the added amount is 0.14%, changes from the initial values are not observed after the test. Hence, it is desirable to add the ultraviolet absorber at least at a concentration of 0.1%, and is more desirable to add at a concentration of 0.14% or above.

In sum, for a Fresnel lens sheet for solar concentration used for a solar module, desired is a material which has as high transmittance as possible in its initial state and experiences only a small decrease in transmittance even after a long-term use. The equation (1) shows a condition for a material having the above characteristics; the left side is the sum of the transmittances of the optical sheet of the present invention before and after the accelerated test, whereas the right side is the sum of the transmittances of an optical sheet before and after the accelerated test, the optical sheet being made of the same base material as that of the optical sheet shown in the left side but containing no ultraviolet absorber. The accelerated test is performed for the time $T_1$ which may be figured out from the equation (2) or the equation (3) as described above.

$$\tau uv(0)+\tau uv(T_1)>\tau_0(0)+\tau_0(T_1) \qquad (1)$$

Once the kind of the base material is determined, the right side is determined by the conditions in the installation location. In the left side, there is a tendency that τuv(0) is smaller when the content of the ultraviolet absorber is larger whereas τuv($T_1$) is larger (decrease in transmittance is smaller) when the content of the ultraviolet absorber is larger. Therefore, the equation (1) is designed to provide an appropriate amount of the ultraviolet absorber to be added.

Meanwhile, in addition to the fact that increasing the amount of the ultraviolet absorber to be added causes coloration and unnecessary cutting of wavelengths which in turn decreases the initial transmittance as mentioned earlier, it has been found that increasing the amount of additive increases the amount of component vaporized during the molding which in turn causes a flaw. For this reason, the amount to be added is preferably kept not greater than 0.3% and, more preferably, not greater than 0.2%, if possible.

The invention claimed is:

1. A design method for a resin optical sheet comprising a base material comprising an ultraviolet absorber, the method comprising
    determining an amount of the ultraviolet absorber required to be present in the base material such that:
    in an accelerated degradation test using a metal-halide-lamp weathering test (device specification: JTM G 01:2000, Japan Testing Machinery Association), a decrease in an average transmittance in a wavelength range of 400 nm to 1850 nm after testing for an irradiation time $T_1$ satisfies $$\tau uv(0)+\tau uv(T_1)>\tau_0(0)+\tau_0(T_1) \qquad (1)$$

and such that a decrease in transmittance at each wavelength in the wavelength range, from a corresponding initial transmittance value to a transmittance value after the accelerated degradation test for the irradiation time $T_1$, is not greater than 10%, where $$T_1 = 150 \times 2.5 \times U_1/U_0 \times \{0.44 \times \ln(W_1/W_0) + 0.88\} \times \qquad (2)$$
$$\{(0.5 \times \cos(\alpha_1 - 23.4)) + \cos\alpha_1\}/\{(0.5 \times \cos(\alpha_0 - 23.4)) + \cos\alpha_0\}$$

$U_1$: an average sunshine duration in an environment in which the optical sheet is used,
    $W_1$: an average amount of water vapor in the environment in which the optical sheet is used,
    $\alpha_1$: a latitude of a location in which the optical sheet is used,
    $U_0$: a sunshine duration in a location (Miyakojima) in which an outdoor exposure test has actually been conducted,
    $W_0$: an average amount of water vapor in the location (Miyakojima) in which the outdoor exposure test has actually been conducted,
    $\alpha_0$: a latitude of the location (Miyakojima) in which the outdoor exposure test has actually been conducted,
    τuv(0): an average transmittance of the optical sheet in the wavelength range of 400 nm to 1850 nm before the accelerated degradation test,
    τuv($T_1$): an average transmittance of the optical sheet in the wavelength range of 400 nm to 1850 nm after the irradiation time $T_1$ of the accelerated degradation test,
    $\tau_0(0)$: an average transmittance of a reference optical sheet in the wavelength range of 400 nm to 1850 nm before the accelerated degradation test, the reference optical sheet being the same as the optical sheet but containing no ultraviolet absorber, and
    $\tau_0(T_1)$: an average transmittance of the reference optical sheet, being the same as the optical sheet but containing no ultraviolet absorber, in the wavelength range of 400 nm to 1850 nm after the irradiation time $T_1$ of the accelerated degradation test,
    wherein the amount of the ultraviolet light absorber is determined according to formula (1).

2. The design method of claim 1, wherein the decrease in the average transmittance is not greater than 7% of an initial value thereof.

3. The design method of claim 1, wherein
    the base material is an acrylic resin, and
    the ultraviolet absorber is a benzotriazole compound.

4. The design method of claim 3, wherein the base material is polymethyl methacrylate.

5. The design method of claim 1, wherein the amount of the ultraviolet absorber is at least 0.14%, based on an amount of the base material.

6. The design method of claim 1, wherein the optical sheet is suitable for solar concentration.

7. The design method of claim 1, wherein the amount of the ultraviolet absorber is at least 0.10%, and at most 0.30%, based on an amount of the base material.

8. The design method of claim 1, wherein the amount of the ultraviolet absorber is at least 0.10%, and at most 0.20%, based on an amount of the base material.

9. The design method of claim 1, wherein the optical sheet is a Fresnel lens sheet.

10. The optical sheet obtained by the design method of claim 1.

11. The design method of claim 1, wherein
    the decrease in the average transmittance is not greater than 7% of an initial value thereof,
    the base material is an acrylic resin, and
    the ultraviolet absorber is a benzotriazole compound.

12. The design method of claim 1, further comprising:
    compounding the base material with the amount of the ultraviolet light absorber determined by formula (1).

13. A design method for a resin optical sheet comprising a base material comprising an ultraviolet absorber, the method comprising
    adding an amount of the ultraviolet absorber to the base material such that, in an accelerated degradation test using a metal-halide-lamp weathering test (device specification: JTM G 01:2000, Japan Testing Machinery Association), a decrease in an average transmittance in a wavelength range of 400 nm to 1850 nm after testing for an irradiation time $T_1$ satisfies $$\tau uv(0)+\tau uv(T_1)>\tau_0(0)+\tau_0(T_1) \qquad (1)$$

and such that a decrease in transmittance at each wavelength in the wavelength range, from a corresponding initial transmittance value to a transmittance value after testing for the irradiation time $T_1$, is not greater than 10%, where $$T_1 = 150 \times 2.5 \times D_1/D_0 \qquad (3)$$

$D_1$: an average amount of direct solar radiation in an environment in which the optical sheet is used,
    $D_0$: an average amount of direct solar radiation in a location (Miyakojima) in which an outdoor exposure test has actually been conducted, $\tau_{UV}(0)$: an average transmittance of the optical sheet in the wavelength range of 400 nm to 1850 nm before the weathering test, $\tau_{UV}(T_1)$: an average transmittance of the optical sheet in the wavelength range of 400 nm to 1850 nm after the irradiation time $T_1$ of the weathering test, $\tau_0(0)$: an average transmittance of a reference optical sheet in the wavelength range of 400 nm to 1850 nm before the weathering test, the reference optical sheet being the same as the optical sheet but containing no ultraviolet absorber, and $\tau_0(T_1)$: an average transmittance of the reference optical sheet, being the same as the optical sheet but containing no ultraviolet absorber, in the wavelength range of 400 nm to 1850 nm after the irradiation time $T_1$ of the weathering test, wherein the amount of the ultraviolet light absorber is determined according to formula (1).

14. The design method of claim 13, wherein the decrease in the average transmittance is not greater than 7% of an initial value thereof.

15. The design method of claim 13, wherein
the base material is an acrylic resin, and
the ultraviolet absorber is a benzotriazole compound.

16. The design method of claim 15, wherein the base material is polymethyl methacrylate.

17. The design method of claim 13, wherein the amount of the ultraviolet absorber is at least 0.14%, based on an amount of the base material.

18. The design method of claim 13, wherein the optical sheet is suitable for solar concentration.

19. The design method of claim 13, wherein the amount of the ultraviolet absorber is at least 0.10%, and at most 0.30%, based on an amount of the base material.

20. The design method of claim 13, wherein the amount of the ultraviolet absorber is at least 0.10%, and at most 0.20%, based on an amount of the base material.

21. The design method of claim 13, wherein the optical sheet is a Fresnel lens sheet.

22. The optical sheet obtained by the design method of claim 13.

* * * * *